United States Patent
Lara-Avila et al.

(10) Patent No.: US 11,950,515 B2
(45) Date of Patent: Apr. 2, 2024

(54) ELECTRICAL CONTACTS FOR LOW DIMENSIONAL MATERIALS

(71) Applicant: GRAPHENSIC AB, Stockholm (SE)

(72) Inventors: Samuel Lara-Avila, Gothenburg (SE); Sergey Kubatkin, Gothenburg (SE); Hans He, Gothenburg (SE)

(73) Assignee: GRAPHENSIC AB, Stockholm (SE)

( * ) Notice: Subject to any disclaimer, the term of this patent is extended or adjusted under 35 U.S.C. 154(b) by 780 days.

(21) Appl. No.: 17/044,504

(22) PCT Filed: Dec. 6, 2018

(86) PCT No.: PCT/SE2018/051258
§ 371 (c)(1),
(2) Date: Oct. 1, 2020

(87) PCT Pub. No.: WO2019/194713
PCT Pub. Date: Oct. 10, 2019

(65) Prior Publication Data
US 2021/0043830 A1    Feb. 11, 2021

(30) Foreign Application Priority Data

Apr. 3, 2018  (SE) .................................... 1850366-4

(51) Int. Cl.
*H01L 43/04*     (2006.01)
*C01B 32/194*    (2017.01)
(Continued)

(52) U.S. Cl.
CPC ........... *H10N 52/80* (2023.02); *C01B 32/194* (2017.08); *G01R 33/07* (2013.01); *H10N 52/01* (2023.02);
(Continued)

(58) Field of Classification Search
None
See application file for complete search history.

(56) References Cited

U.S. PATENT DOCUMENTS

| 2012/0168722 A1 | 7/2012 | Chung et al. |
| 2012/0199815 A1 | 8/2012 | Kondo et al. |

(Continued)

FOREIGN PATENT DOCUMENTS

| WO | 2016071317 A1 | 5/2016 |
| WO | 2017218488 A1 | 12/2017 |

OTHER PUBLICATIONS

Bharadwaj, B.K. et al., "Making consistent contacts to graphene: effect of architecture and growth induced defects," Nanotechnology, vol. 27, No. 20, Apr. 2016, 6 pages.

(Continued)

*Primary Examiner* — Jack S Chen
(74) *Attorney, Agent, or Firm* — RMCK Law Group, PLC (57) ABSTRACT

The present invention relates to a method for connecting an electrical contact to a nanomaterial carried by a substrate. At least one layer of soluble lithography resist is provided on the nanomaterial. An opening in the at least one layer of resist exposes a surface portion of the nanomaterial. At least a portion of the exposed surface portion of the nanomaterial is removed to thereby expose the underlying substrate and an edge of the nanomaterial. A metal is deposited on at least the edge of the nanomaterial and the exposed substrate such that the metal forms an electrical contact with the nanomaterial. Removing at least a portion of the soluble lithography resist from the nanomaterial such that at least a portion of the two-dimensional material is exposed.

10 Claims, 9 Drawing Sheets

(51) Int. Cl.
  *G01R 33/07* (2006.01)
  *H10N 52/01* (2023.01)
  *H10N 52/80* (2023.01)
  *B82Y 15/00* (2011.01)
  *B82Y 40/00* (2011.01)
  *H10N 52/00* (2023.01)

(52) U.S. Cl.
  CPC .............. *B82Y 15/00* (2013.01); *B82Y 40/00* (2013.01); *C01B 2204/22* (2013.01); *H10N 52/101* (2023.02)

(56) References Cited

U.S. PATENT DOCUMENTS

| | | | |
|---|---|---|---|
| 2015/0235856 | A1 | 8/2015 | Hwang et al. |
| 2015/0364567 | A1 | 12/2015 | Feng et al. |
| 2015/0364589 | A1 | 12/2015 | Lee et al. |
| 2016/0172596 | A1 | 6/2016 | Rutherglen |
| 2016/0240692 | A1 | 8/2016 | Shepard et al. |
| 2017/0062345 | A1 | 3/2017 | Saito et al. |
| 2017/0133336 | A1 | 5/2017 | Oliver et al. |
| 2017/0194582 | A1 | 7/2017 | Han |
| 2017/0244054 | A1 | 8/2017 | Bangsaruntip et al. |
| 2017/0345950 | A1 | 11/2017 | Sato et al. |
| 2017/0358451 | A1 | 12/2017 | Ramos et al. |
| 2018/0040737 | A1 | 2/2018 | Nam et al. |
| 2021/0043830 | A1* | 2/2021 | Lara-Avila .......... H01L 21/0332 |

OTHER PUBLICATIONS

Communication Pursuant to Article 94(3) EPC dated Mar. 9, 2023 for EP Application No. 18913536.1, 8 pages.

Song, S. et al., "Improvement of graphene-metal contact resistance by introducing edge contacts at graphene under metal," Applied Physics Letters, vol. 104, No. 18, May 2014, pp. 183506-1-183506-3.

Yoo, G. et al., "Electrical Contact Analysis of Multilayer MoS2 Transistor With Molybdenum Source/Drain Electrodes," IEEE Electron Device Letters, vol. 36, No. 11, Nov. 2015, pp. 1215-1218.

Chu, T. et al., "Understanding the Electrical Impact of Edge Contacts in Few-Layer Graphene," ACSNANO, vol. 8, No. 4, 2014, pp. 3584-3589.

Giubileo, F. et al., "The role of contact resistance in graphene field-effect devices," Progress in Surface Science, vol. 92 (2017), pp. 143-175.

Leonard, F. et al., "Electrical contacts to one- and two-dimensional nanomaterials," Nature Nanotechnology, vol. 6, Nov. 2011, pp. 773-783.

Micro Chem Data Sheet, "Nano PMMA and Copolymer," 2001, 8 pages.

Park, H-Y, et al., "Extremely Low Contact Resistance on Graphene through n-Type Doping and Edge Contact Design," Advanced Materials, vol. 28 (2016), pp. 864-870.

PCT International Search Report and Written Opinion dated Jan. 29, 2019 for International Application No. PCT/SE2018/051258, 10 pages.

Robinson, J. et al., "Contact graphene," Applied Physics Letters, vol. 98 (2011), 4 pages.

Schulman, D. et al., "Contact engineering for 2D materials and devices," Chem. Soc. Rev., vol. 47, No. 9, May 7, 2018, pp. 3037-3058.

Swedish Patent and Registration Office (PRV) Office Action and Swedish Search Report dated Oct. 22, 2018 for Swedish Application No. 1850366-4, 10 pages.

Anishchenko, E.V. et al., "The Formation of Multilayer Resist Mask for Transistor T-gates Fabrication Using Electron-Beam Lithography," XII International Conference and Seminar EDM '2011, Section III, Jun. 30-Jul. 4, 2011, pp. 146-149.

Extended European Search Report dated Nov. 25, 2021 for European Patent Application No. 18913536.1, 11 pages.

Hülsmann, A. et al., "0.15 µm T-Gate E-Beam Lithography Using Crosslinked P(MMA/MAA) Developed in Ortho-Xylene Resulting in High Contrast and High Plasma Stability for Dry Etched Recess Gate Pseudomorphic MODFETs for MMIC Production," Microelectronic Engineering, Elsevier Publishers BV., Amsterdam, NL, vol. 23, Nos. 1-4, Jan. 1, 1994, pp. 437-440.

\* cited by examiner

ELECTRICAL CONTACTS FOR LOW DIMENSIONAL MATERIALS

CROSS-REFERENCE TO RELATED APPLICATIONS

This application is a 371 U.S. National Stage of International Application No. PCT/SE2018/051258, filed Dec. 6, 2018, which claims priority to Swedish Patent Application No. 1850366-4, filed Apr. 3, 2018. The disclosures of each of the above applications are incorporated herein by reference in their entirety.

FIELD OF THE INVENTION

The present invention relates to a method for connecting an electrical contact to a nanomaterial carried by a substrate. The present invention further relates to an electrical connection structure for an electronic device, and to an electronic device.

BACKGROUND OF THE INVENTION

The performance and reliability of electronic devices based on nanomaterials such as two-dimensional materials depend at least partly on the quality of electrical contacts connected to the nanomaterial. It has been historically challenging to fabricate low-ohmic contacts to two-dimensional materials due to problems related to interfacing 3D metallic contacts with low-dimensional materials. In addition, similar problems have been experienced with fabricating electrical contacts connected to one-dimensional materials such as nanotubes and nanowires.

One promising candidate two-dimensional material for electronic applications is monolayer graphene. However, forming high quality electrical contacts to graphene has traditionally been difficult both due to lack of chemical bonding to the metal contact and local distortion of electrical properties underneath the metal contact.

US2016/0240692 describes one potential solution to the above-mentioned problems. US2016/0240692 describes to fabricate one-dimensional edge contacts to exfoliated graphene flakes encapsulated by hexagonal boron nitride (hBN). This method produces low-ohmic contacts but is not scalable to real-world applications due to the microscopic size of hBN flakes and the required manual manipulation of the graphene flakes.

Accordingly, there appears to be a need for improvements with regards to the quality of electrical edge contacts for connecting to nanomaterials such as two-dimensional materials or one-dimensional materials.

SUMMARY

In view of the above-mentioned and other drawbacks of the prior art, it is an object of the present invention to provide a method for producing improved electrical edge contacts for connecting to nanomaterials of at least one dimension.

According to a first aspect of the present invention, it is therefore provided a method for connecting an electrical contact to nanomaterial of at least one dimension carried by a substrate, the method comprising: providing a substrate supporting a nanomaterial of at least one dimension and at least one layer of soluble lithography resist applied on the nanomaterial, wherein an opening in the at least one layer of resist exposes a portion of the nanomaterial, wherein, in the opening, an upper portion of the at least one layer of resist extends beyond a lower portion of the at least one layer of resist, thereby forming an overhang portion, removing at least a portion of the exposed portion of the nanomaterial, thereby exposing the underlying substrate and an edge of the nanomaterial, depositing a metal on at least the edge of the nanomaterial and the exposed substrate, the metal forming an electrical contact with the nanomaterial, removing at least a portion of the soluble lithography resist from the nanomaterial such that at least a portion of the nanomaterial is exposed.

The present invention is based on the realization that by a suitable structure of resist, it is possible to remove at least part of the nanomaterial via an opening in the resist structure, and subsequently deposit a metal through the opening. The metal makes electrical connection with an edge of nanomaterial formed from the removing of the portion of nanomaterial. The metal contact makes physical connection with the substrate under the nanomaterial at the location where the nanomaterial has been etched away. Thereby, the metal contact is advantageously strongly anchored to the substrate. Further, it was realized that the metal contact making electrical connection with the edge of the nanomaterial can be manufactured in a scalable way using relatively standard fabrication processes which thereby provides for a less complicated way of obtaining improved electrical connections to nanomaterials. Thus, the inventive method enables improved scalability of producing metal contacts for nanomaterials. Thus, it is straight-forward to produce more than one metal contact on the same substrate in a single manufacturing flow using the inventive concept.

With the inventive concept, there is no need for complicated encapsulation of the nanomaterials as suggested by prior art methods. Further, with the inventive method the nanomaterial may be open for functionalization, encapsulation, or any other further processing after manufacturing of the metal contacts and the resist is removed.

With the inventive concept, it is thus possible to reliably fabricate low-ohmic edge metal contacts, with high yield compared to prior art methods.

An edge of the nanomaterial is meant to be the "step" or side wall in the nanomaterial formed after a portion of the nanomaterial has been etched away. The edge is thus preferably the side wall portion connecting the upper surface of the nanomaterial and the substrate supporting the nanomaterial.

That the nanomaterial is supported by the substrate includes that the entire layer of nanomaterial is directly or indirectly (e.g. via another material) in contact with the substrate. It also includes that only a portion of the entire nanomaterial is directly or indirectly (e.g. via another material) in contact with the substrate, for instance the nanomaterial may be suspended over a cavity or through hole in the substrate.

A soluble lithography resist may be comprised of a polymer and are generally processed for producing a layered structure defining a pattern for following manufacturing steps. For instance, a soluble lithography resist may be spun onto a substrate, cured at an elevated temperature, and subsequently selectively exposed to e.g. UV-light or an electron beam. The portions of the resist that has been exposed to e.g. UV-light, electron beam, or X-rays may be dissolved in a suitable liquid developer in the case of a so-called "positive" resist. In case of a "negative" resist, the portions not exposed to e.g. UV-light or an electron beam is dissolved by the developer. It is noted that soluble lithography resists, and suitable developers are per se known to the skilled person.

The overhang portion may be generally known as an "undercut". In a cross section of the lithography resist and the opening in the resist, the upper portion thus extends beyond a portion closer to the substrate.

In one embodiment, the at least one layer may comprise three layers of soluble lithography resist, wherein the intermediate layer of resists is faster soluble in a developer configured to dissolve the three layers of soluble lithography resist compared to the other two layers, wherein a portion of the upper layer of the three layers forms the overhang portion over at least the bottom layer. Hereby, an advantageous layered structure of lithography resist which facilitates the further manufacturing steps for forming the electrical metal contact.

According to another advantageous embodiment, the at least one layer of resist may comprise three layers of soluble lithography resist, wherein the top layer of resist is soluble in a first developer, and the intermediate layer and bottom layer are soluble in a second developer that the top layer of resist is not soluble in, the intermediate layer and the bottom layer are not soluble in the first developer, wherein a portion of the upper layer of the three layers forms the overhang portion over at least the bottom layer.

Several possible soluble lithography resists exist, some examples are P(MMA) and P(MMA)-MMA. For example, the three layers of resist may comprise a bottom layer comprising P(MMA), a top layer comprising AR-P 6200.13, and a middle layer comprising P(MMA)-MMA. The thickness of each individual layer depends on the specific process and desired thickness of the metal forming the electrical contact.

The bottom layer of resist also extends beyond the intermediate layer into the opening. Thus, in a cross-section of the lithography resist and the opening, a horizontal groove is formed in the intermediate layer compared to the uppermost and bottom layers.

The metal may be deposited by sputtering, e-beam evaporation, thermal evaporation, or laser ablation.

A nanomaterial in accordance with the present inventive concept is a low-dimensional material which is in the nanoscale in at least one dimension. That the nanomaterial in accordance with the inventive concept is of at least one dimension means that one of the dimensions of the nanomaterial is not at the nanoscale. For example, the nanomaterial may be a nanotube which has one dimension along the longitudinal axis of the tube which is not in the nanoscale. However, the other two dimensions are at the nanoscale. A nanoscale according to the inventive concept is approximately 0.2 nm to 100 nm.

The nanomaterial may be a two-dimensional material, thereby comprising a single atomic layer or a few atomic layers of one or more atomic species.

The two-dimensional material may be a relatively large layer (sometimes referred to as a sheet) of a single or few atomic layers of a one or more atomic species, or it may be a narrow ribbon of a single or few atomic layers of one or more atomic species (a so-called nanoribbon).

The two-dimensional material may be any two dimensional material exfoliated (i.e. cleaved) from its parent material, or grown on a substrate by chemical vapor deposition (CVD) or epitaxially on a substrate.

In possible implementations, the two-dimensional material is epitaxial graphene. The graphene may be produced by e.g. chemical vapor deposition, or from thermal decomposition of SiC, mechanical exfoliation, molecular beam epitaxy (MBE) growth, etc.

The substrate is preferably Silicon-carbide, in particular when the two-dimensional material is an epitaxial graphene layer or an epitaxial graphene nanoribbon.

According to an embodiment of the invention, removing at least a portion of the exposed portion of the nanomaterial may comprise etching of the nanomaterial with oxygen plasma, or other reactive ion etching processes. Oxygen plasma etching is advantageous for the case when the two-dimensional material is graphene, since oxygen plasma is gentle to the lithography resist and to the substrate. Other two dimensional inorganic materials may require different etchants or techniques. In case of a two-dimensional material it is a surface portion that is exposed in the opening in the resist layers.

According to a second aspect of the present invention, there is provided an electrical connection structure for an electronic device, the electrical connection structure comprising: a nanomaterial of at least one dimension carried by a substrate, the nanomaterial comprising an edge portion adjacent to a substrate surface portion, a metal contact anchored to the substrate surface portion and connected to the edge portion of the nanomaterial, such that the metal contact makes electrical connection with the nanomaterial through contacting the edge portion.

The nanomaterial may be functionalized with organic or inorganic molecules or encapsulated with organic or inorganic dielectric. Thus, organic or inorganic molecules may be deposited on the nanomaterial.

Further embodiments of, and effects obtained through this second aspect of the present invention are largely analogous to those described above for the first aspect of the invention.

There is further provided an electronic device comprising the electrical connection structure. The electronic device may be any one of a quantum resistance standard device, a Hall effect sensor, a gas sensor, or a chemiresistor.

Further features of, and advantages with, the present invention will become apparent when studying the appended claims and the following description. The skilled addressee realizes that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

In the present detailed description, various embodiments of the inventive concept are mainly described with reference to a nanomaterial in the form of a two-dimensional material comprised of graphene. However, it should be noted that this by no means limits the scope of the present invention, which is equally well applicable to any two dimensional material produced from its parent material or grown on a substrate. Accordingly, the inventive concept is applicable to two-dimensional materials in the form of a single atomic layer or a few atomic layers (i.e. multi-layer) of one or more atomic species. The nanomaterial may in some possible implementations be a narrow ribbon of a single or a few atomic layers of one or more atomic species (a so-called nanoribbon). Furthermore, the inventive concept is equally well applicable to one-dimensional materials such as nanotubes, e.g. carbon nanotubes.

FIG. 1a-d schematically illustrates a manufacturing flow for producing an electrical connection for electrically contacting a nanomaterial.

Figure 1A:
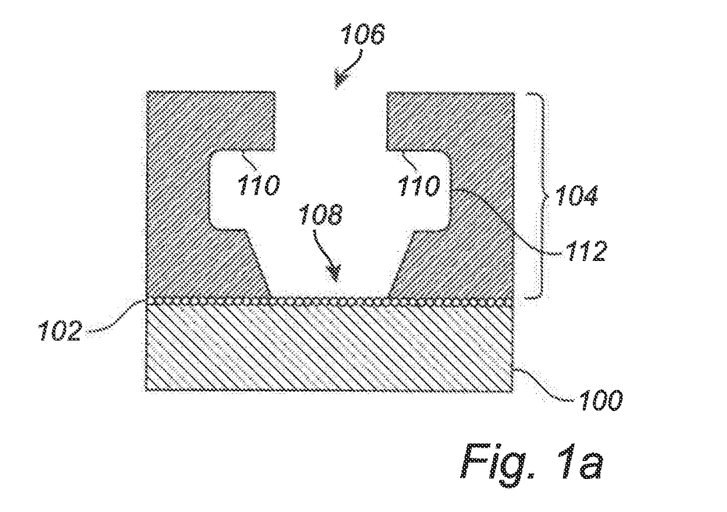
FIG. 1*a-d* schematically illustrates a manufacturing flow for producing an electrical connection for electrically contacting a nanomaterial.

FIG. 1a, illustrates a substrate 100 having thereon a layer of a nanomaterial in the form of a two-dimensional material 102. The two-dimensional material 102 may be any two dimensional material produced from its parent material. In one possible implementation, the two-dimensional material 102 is epitaxial graphene produced by thermal decomposition of a silicon-carbide substrate 100. Other possibilities are to produce the epitaxial graphene on the substrate by chemical vapor deposition. The epitaxial graphene may be wafer scale graphene grown on the silicon-carbide substrate 100.

There is schematically illustrated a layered structure of soluble lithography resist 104 on the two-dimensional material 102. The layered structure of soluble lithography resist 104 may comprise at least one layer of lithography resist.

An opening 106 in the resist layer 104 exposes a surface portion 108 of the two-dimensional material 102. The surface portion 108 is clear of lithography resist in the opening 106. When the opening 106 was formed, a so-called "undercut" was obtained. Thus, an upper portion 110 extends beyond a lower portion 112 of resist such that an overhang portion 110 is formed. Thus, the width of the opening 106 is smaller at the upper portion 110 than at the lower portion 112.

It should be noted that the nanomaterial 102 may equally well be a nanotube, (e.g. carbon nanotube), or a nanowire, or a nanoribbon.

Figure 1B:
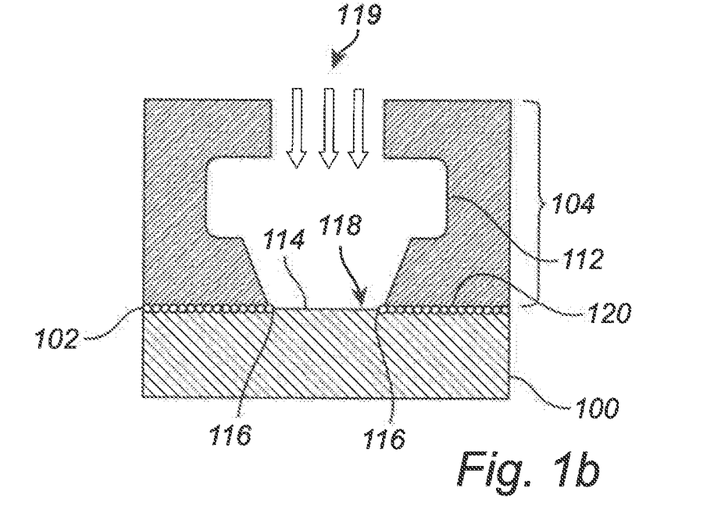

FIG. 1b conceptually illustrates removing at least a portion of the exposed surface portion 108 of two-dimensional material 102 to thereby expose the underlying substrate portion 114. Further, removing the exposed surface portion 108 of the two-dimensional material 102 causes an edge 116 to be formed in the two-dimensional material. The edge 116 is the step (i.e. comprising a side wall) formed between the two-dimensional material 102 and the exposed substrate portion 114. The edge 116 connects the substrate surface 118 in the exposed substrate portion 114 to the upper surface 120 of the two-dimensional material 102.

Removing the exposed surface portion 108 may be performed by application of oxygen-plasma on the exposed surface portion 108. The oxygen plasma may be applied for about one minute at 50 W and 250 mT, at 10 sccm oxygen flow. However, the parameters for the etching with oxygen plasma may vary depending on e.g. lithography resist thickness and the above serves merely as an example. Other etching techniques may be used in place of oxygen plasma etching, such as reactive using other species than oxygen, or ion milling. Oxygen plasma etching is advantageous because it is gentle to the lithography resist 104. The application of the plasma or ions are indicated by the arrows 119.

Figure 1C:
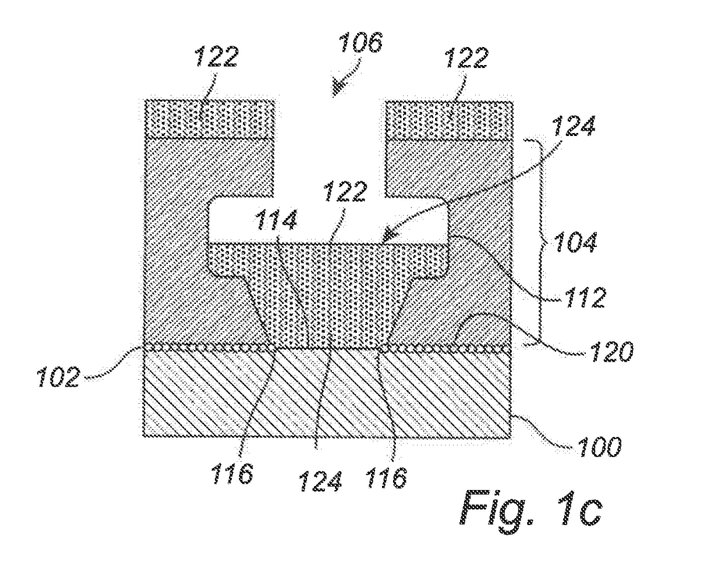

As conceptually illustrate in FIG. 1c, a metal 122 is deposited at least on the edge 116 of the two-dimensional material 102 and on the exposed substrate portion 114. Thus, metal 122 is deposited through the opening 106 and onto the edge 116 of the two-dimensional material 102 and onto the exposed substrate portion 114. The metal 122 deposited on the exposed substrate portion 114 is deposited directly on the substrate 100 which thus enables a strong anchoring for the metal contact 124 (comprising metal 122) formed in the opening 106. The physical contact between the two-dimensional material 102 and the metal contact 124 at the edge 116 provides an electrical connection between the two-dimensional material 102 and the metal contact 124. One possible example metal contact configuration comprises about 5 nm of titanium under an about 80 nm layer of gold deposited by physical vapor deposition. Another example is sputtering of a ca 20 nm layer of niobium nitride (which is superconducting below its critical temperature).

Figure 1D:
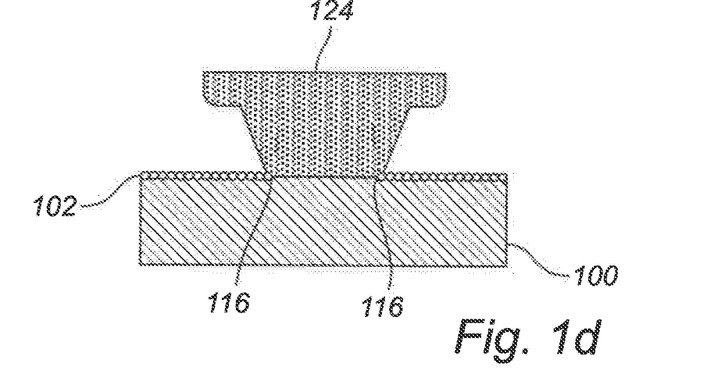

Now turning to FIG. 1d. The soluble lithography resist 104 is removed by a so-called lift-off process to remove at least a portion of the soluble lithography resist 104 and the metal 122 deposited on the soluble lithography resist 104. As a result, the metal contact 124 is left anchored to the substrate 102 at the surface portion 114, and electrically connected to the edge 116 of the two-dimensional material 102.

The metal may be deposited by e.g. physical vapor deposition (e.g. e-beam, thermal evaporation, or sputtering).

The two-dimensional material 102 may be graphene grown on a substrate 100 comprised of silicon carbide or produced transferring graphene onto a silicon substrate.

Figure 2:
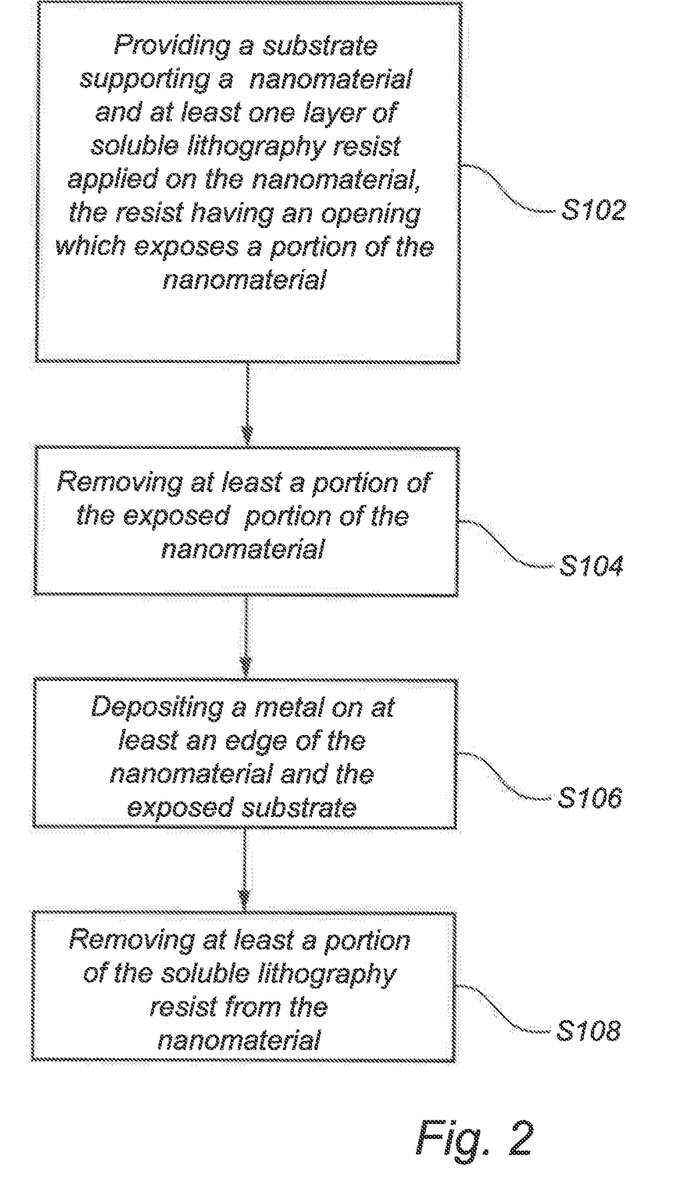
FIG. 2 is a flow-chart of method steps according to embodiments of the invention.

FIG. 2 is a flow chart of method steps according to embodiments of the invention. In step S102 is a substrate provided which supports a nanomaterial and at least one layer of soluble lithography resist applied on the nanomaterial. An opening in the at least one layer of resist exposes a surface portion of the nanomaterial. An upper portion of the at least one layer of resist extends beyond a lower portion of the at least one layer of resist in the opening. In this way, an overhang portion is formed. Subsequently, in step S104 is at least a portion of the exposed surface portion of the nanomaterial removed from the substrate, which thereby exposes the underlying substrate and an edge of the nanomaterial. In step S106 is a metal deposited on at least the edge of the nanomaterial and the exposed substrate. The metal forms an electrical contact with the nanomaterial. Moreover, at least a portion of the soluble lithography resist is removed from the nanomaterial in step S108 such that at least a portion of the nanomaterial is exposed. The nanomaterial is of at least one dimension and may be e.g. a two-dimensional material or a nanotube, or a set of nanotubes.

Figure 3A:
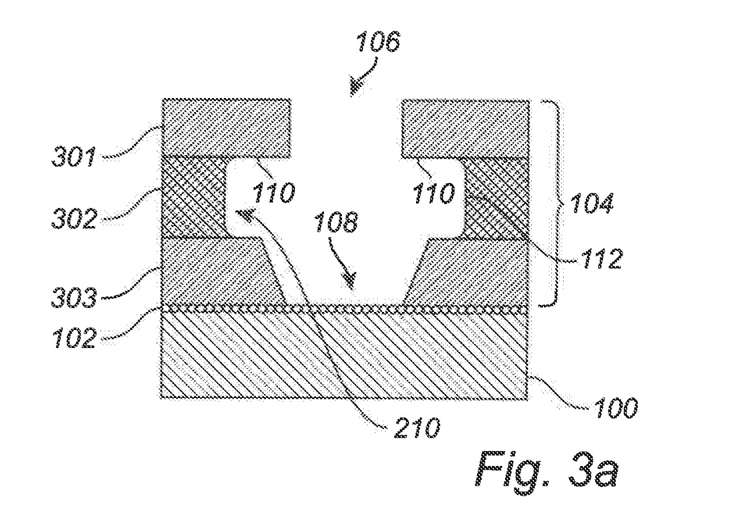
FIG. 3*a-d* schematically illustrates a manufacturing flow for producing an electrical connection for electrically contacting a nanomaterial.
Figure 3B:
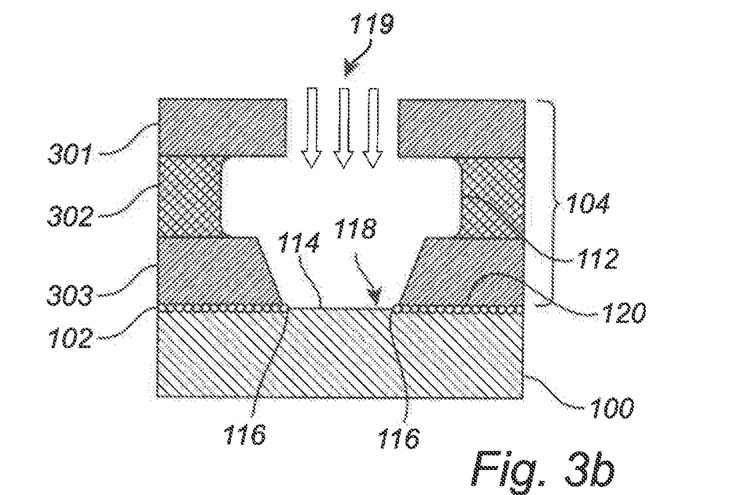
Figure 3C:
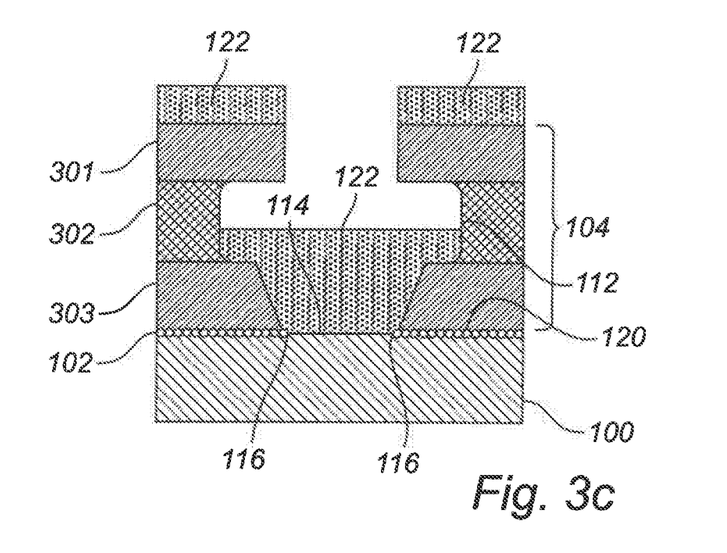
Figure 3D:
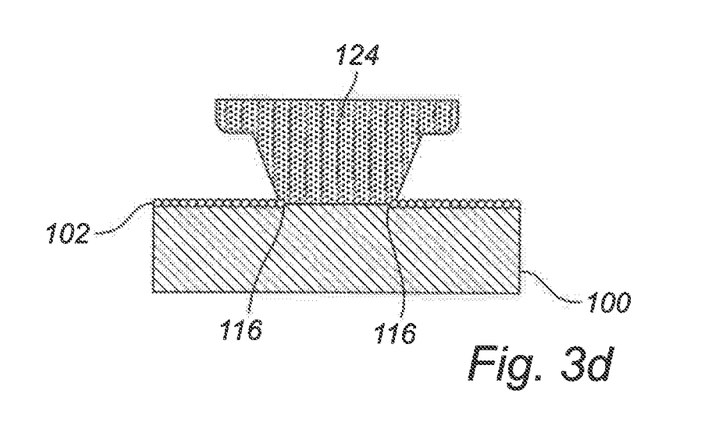

FIG. 3a illustrates that the substrate 100 may be provided with three layers of soluble lithography resist 301, 302, and 303. This layered structure of resist provides for a reliable way of forming the overhang portion 110, i.e. the "undercut". Similar to FIG. 1b, in FIG. 3b the exposed surface portion 108 of two-dimensional material 102 (or nanotube 102 according to possible implementations) is removed from the substrate 100 using e.g. oxygen plasma. Thus exposing the substrate portion 114 under the removed the exposed portion 108 of two-dimensional material 102. Further, edge portions 116 of the two-dimensional material are exposed. As shown in FIG. 3c, a metal 122 is deposited on the edge 116 of the two-dimensional material 102 and on the exposed substrate portion 114. Removing the three layers of soluble lithography resist 301, 302, 303 and the metal 122 on the uppermost resist layer 301 leaves the metal contact 124 anchored to the exposed substrate portion 114 and connected to the edge 116 as shown in FIG. 3d.

The intermediate layer of resist 302 is faster soluble in a developer configured to dissolve the three layers of soluble lithography resist compared to the other two layers 301 and 303. Thus, when producing the layered structure of resist the intermediate layer will form a groove under the upper layer 301 in the layered structure. Thus a portion 110 of the upper layer of the three layers forms the overhang portion over at least the bottom layer 303.

In one possible implementation, the top layer of resist 301 is soluble in a first developer. Further, the intermediate layer 302 and the bottom layer of resist are soluble in a second developer that the top layer 301 is not soluble in, or at least substantially slower dissolved in. Thus, first the opening is defined in the top layer 301 using the first developer. Next, the intermediate layer 302 and the bottom layer are partly dissolved using the second developer. The intermediate layer is faster dissolved by the second developer, thereby forming a groove or sideways cavity 210 between the bottom 303 and upper layer 301 such that an under-cut is formed by developing for suitable time duration.

The layer 301 may be the lithography resist AR-P 6200.13 (developed in o-xylene), the intermediate layer 302 may be P(MMA-MAA), and the bottom layer 303 may be PMMA, both developed in a mixture of isopropanol and water (or methyl isobutyl ketone dissolved in isopropanol).

The layers of lithography resist may however comprise other possible lithography resists, and their respective developer solutions, and the above merely serves as an example. For instance the AR-P 6200.13 may be replaced by S1813 and the PMMA by LOR3A. One could also employ negative resists such as UVN2300 and ma-NA2401.

The metal 122 may comprise gold, aluminum, titanium, palladium, chromium niobium, niobium nitride, etc., with a typical thickness of about 3 Å to 2000 Å.

Applying a resist layer may be performed by spin-coating known per se to the skilled person, as well as chemical vapor deposition and physical vapor deposition.

Figure 4A:
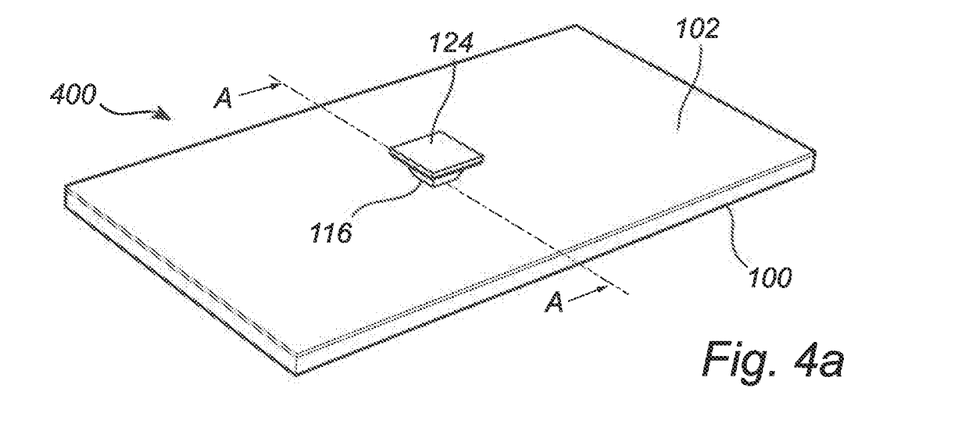
FIG. 4*a* is a conceptual perspective view of an electrical connection structure for an electronic device.
Figure 4B:
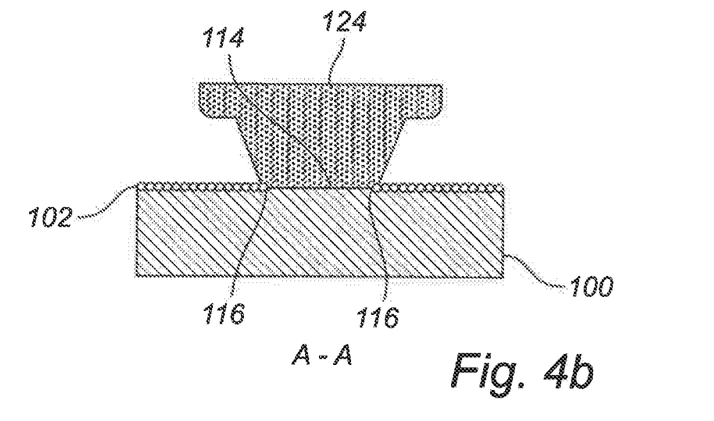
FIG. 4*b* is a cross-section of the electrical connection structure shown in FIG. 4*a*.
Figure 4C:
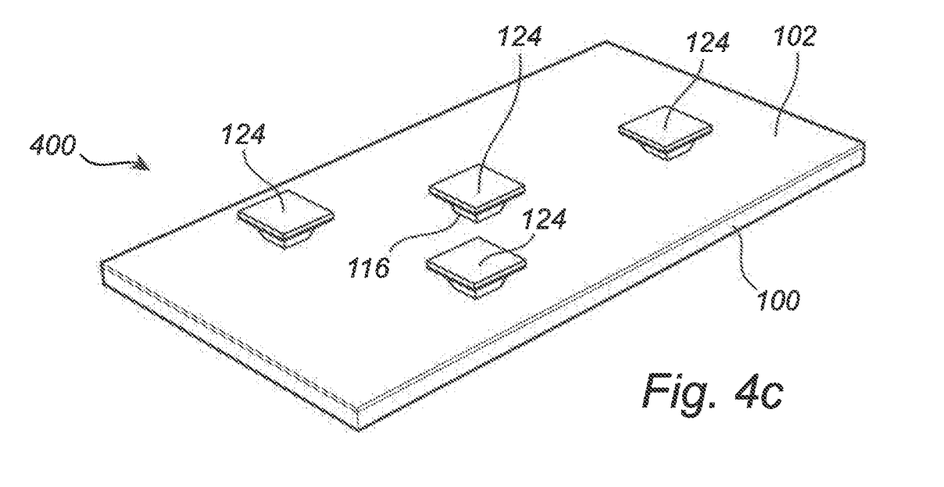
FIG. 4*c* illustrates a plurality of electrical connection structure for an electronic device.

FIG. 4a is a conceptual perspective view of an electrical connection structure 400 for an electronic device and FIG. 4b is a cross-section of the electrical connection structure 400 shown in FIG. 4a. The electrical connection structure 400 may be used for electrically connecting an electronic device (not shown) on the substrate 100 to external electrical circuitry (not shown). The electrical connection structure 400 comprises a layer of two-dimensional material 102 carried by substrate 100. In one possible implementation is the two-dimensional material 102 graphene carried by a silicon-carbide substrate 100. The graphene may for instance be produced by thermal decomposition of silicon carbide. Moreover, a metal contact 124 is anchored to a substrate surface portion 114 adjacent to an edge portion 116 of the two-dimensional material 102. The size of the metal contact 124 in a plane parallel to the substrate 100 surface may be e.g. 300 µm by 300 µm, 100 µm by 100 µm, 10 µm by 10 µm, 1 µm by 1 µm, but the size and shape may be arbitrary and the geometry of the metal contact is limited only by the substrate size (for example, the metal contact may be square as indicated by the above measures, rectangular, polygonal, circular, oval, etc.) and within the scope of the invention, but here the above size serves as an example. The metal contact 124 makes electrical connection with the two-dimensional material 102 through contacting the edge portion 116. Further, as illustrated in FIG. 4c, plurality metal contacts 124 may be formed and connected to respective edge portions of the two dimensional material 102.

Figure 5:
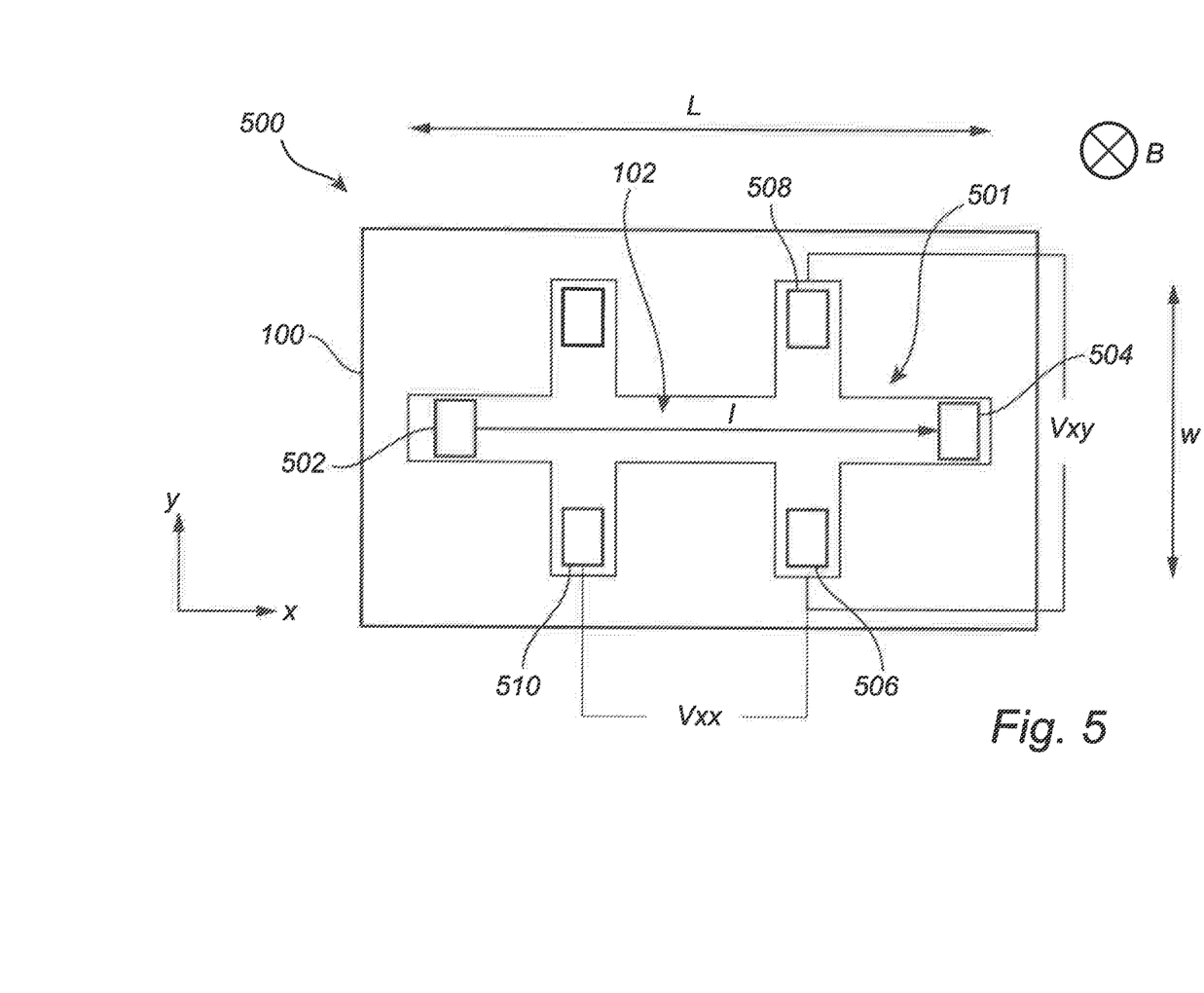
FIG. 5 conceptually illustrates an example electronic device according to embodiments of the invention, and FIG. 6a-f conceptually illustrates one possible manufacturing flow for obtaining a substrate with layers of resist on a nanomaterial.

FIG. 5 is a schematic top view of an example conceptual electronic device 500. The electronic device is here illustrated as a Hall bar 501 which may be used as an embodiment or realization of a quantum resistance standard by using the quantum Hall effect in the device, or as a Hall Effect sensor for measuring a magnetic field strength.

The electronic device 500 may be fabricated using conventional lithography using e.g. electron beam lithography and/or photolithography, which are per se known to the skilled person.

The electronic device 500 comprises at least four metal contacts connected to the two-dimensional material 102. Two metal contacts 502, 504 are arranged for enabling a current (I) to be passed through the two dimensional material in the x-direction, a longitudinal direction of the Hall bar 500. The two connection pads 506, 508 are arranged as output ports for measuring transverse voltage ($V_{xy}$) when the current (I) is passed through the two-dimensional material in the device 500 in the longitudinal direction (x). The two connection pads 506, 508 are spatially separated in the transverse direction (y). Furthermore, a longitudinal voltage ($V_{xx}$) may be measured between connection pad 506 and an additional connection pad 510 spatially separated from the connection pad 506 in the longitudinal (x) direction. The size of a hall bar 501 may for example be: w=5 mm×L=3 mm, w=30 µm×L=100 µm, W=2 µm×L=10 µm. Each of the metal contacts 502, 504, 506, 508, and 510 are manufactured and connected to an edge of the two-dimensional material 102 as described with reference to previous drawings. Other possible electronic device may be e.g. gas sensors and chemiresistors.

Figure 6A:
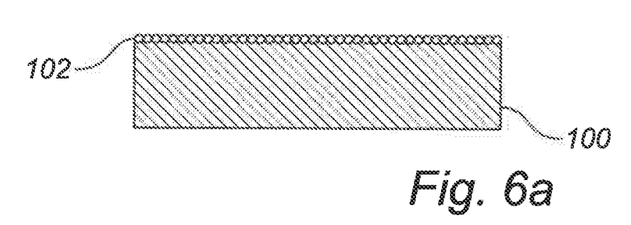
Figure 6B:
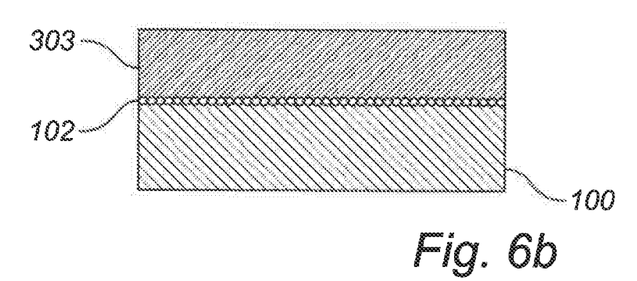
Figure 6C:
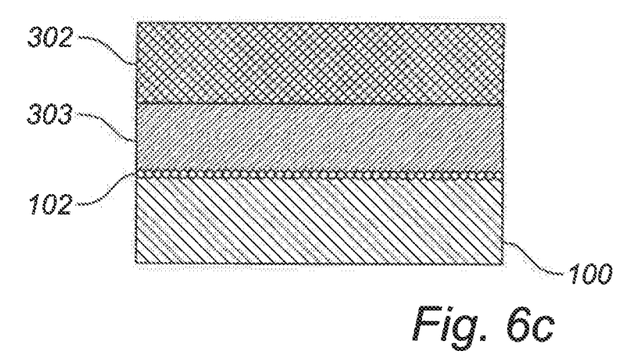
Figure 6D:
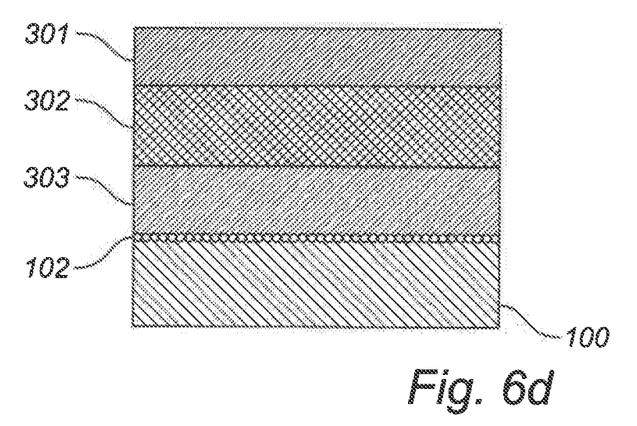
Figure 6E:
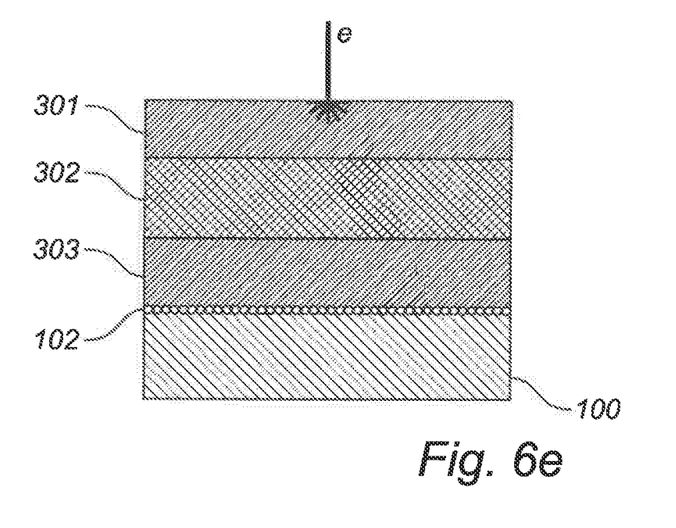

The layered resist structure shown in FIG. 1a and FIG. 3a may be achieved in various ways for providing the substrate with the nanomaterial and the soluble lithography resist. One possible way will briefly be described here. FIG. 6a shows a substrate having thereon a nanomaterial. Next, in FIG. 6b, has a layer of a first lithography resist been applied to the nanomaterial by e.g. spin coating and baking at an elevated temperature. The resist 303 may be P(MMA) (e.g. about 100 nm thick). In FIG. 6c has a second layer 302 of resist been added, here in the form of P(MMA-MAA) (e.g. about 280 nm thick) by spin-coating and baking at an elevated temperature. A top layer 301 of resist is finally added by spin coating and baking at an elevated temperature. The top layer 301 may be AR-P6200 (e.g. about 180 nm thick, AR-P6200 is a positive e-beam resist and serves as an example e-beam resist herein, other resists may be equally well applicable). In this particular example, the lithography resists are electron beam sensitive resists, however, other alternatives exist. Thus, the layers 301-303 of resist are exposed by an electron beam (e), as conceptually illustrated in FIG. 6e.

After development in a suitable combination of developers, here, first the top layer 301 may be developed in o-xylene (about 30 seconds), and the other two layers 302 and 303 may be developed in a mixture of isopropanol (e.g. about 93%) and water (e.g. about 7%) (for about 40 s), is the desired opening 106 in the layers of resist obtained with the overhang portions 110.

Figure 6F:
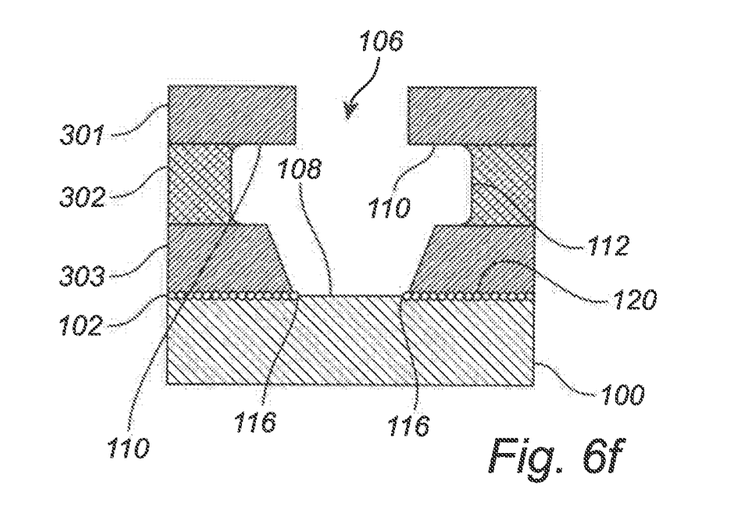

It is noted that the scheme for providing the layered resist structure conceptually shown in FIG. 6f, (and FIG. 1a, and FIG. 3a) only serves as an example and that multiple other possible schemes may provide the same result. The invention is applicable regardless of how the layered resist structure conceptually shown in FIG. 6f, (and FIG. 1a, and FIG. 3a) is obtained.

The person skilled in the art realizes that the present invention by no means is limited to the preferred embodiments described above. On the contrary, many modifications and variations are possible within the scope of the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A method for connecting an electrical contact to a nanomaterial of at least one dimension supported by a substrate, the method comprising:
   providing a substrate supporting a nanomaterial of at least one dimension and at least one layer of soluble lithography resist applied on the nanomaterial, wherein an opening in the at least one layer of resist exposes a portion of the nanomaterial, wherein, in the opening, an upper portion of the at least one layer of resist extends beyond a lower portion of the at least one layer of resist, thereby forming an overhang portion,
   removing at least a portion of the exposed portion of the nanomaterial, thereby exposing the underlying substrate and an edge of the nanomaterial,
   depositing a metal on at least the edge of the nanomaterial and the exposed substrate, the metal forming an electrical contact with the nanomaterial,
   removing at least a portion of the soluble lithography resist from the nanomaterial such that at least a portion of the nanomaterial is exposed.

2. The method according to claim 1, wherein the nanomaterial is a two-dimensional material, a nanotube, a nanoribbon, or a nanowire.

3. The method according to claim 2, wherein the two-dimensional material is graphene.

4. The method according to claim 2, wherein the nanomaterial is a single layer or multilayer two-dimensional material.

5. The method according to claim 1, wherein the at least one layer comprises three layers of soluble lithography resist, wherein the intermediate layer of resists is faster soluble in a developer configured to dissolve the three layers of soluble lithography resist compared to the other two layers, wherein a portion of the upper layer of the three layers forms the overhang portion over at least the bottom layer.

6. The method according to claim 5, wherein the bottom layer of resist extends beyond the intermediate layer into the opening.

7. The method according to claim 1, wherein the at least one layer comprises three layers of soluble lithography resist, wherein the top layer of resist is soluble in a first developer, and the intermediate layer and bottom layer are soluble in a second developer that the top layer of resist is not soluble in, the intermediate layer and the bottom layer are not soluble in the first developer, wherein a portion of the upper layer of the three layers forms the overhang portion over at least the bottom layer.

8. The method according to claim 1, wherein the metal is deposited by physical vapor deposition such as sputtering, e-beam evaporation, thermal evaporation, or laser ablation.

9. The method according to claim 1, wherein the substrate is comprised of silicon-carbide or silicon.

10. The method according to claim 1, wherein the removing at least a portion of the exposed portion of the nanomaterial comprises etching of the nanomaterial with reactive ion etching, such as oxygen plasma, or ion milling.

* * * * *